United States Patent
Matsui

(10) Patent No.: US 9,824,725 B2
(45) Date of Patent: Nov. 21, 2017

(54) SEMICONDUCTOR DEVICE WITH SINGLE ENDED MAIN I/O LINE

(71) Applicant: Micron Technology, Inc., Boise, ID (US)

(72) Inventor: Yoshinori Matsui, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/493,816

(22) Filed: Apr. 21, 2017

(65) Prior Publication Data

US 2017/0236560 A1 Aug. 17, 2017

Related U.S. Application Data

(63) Continuation of application No. 14/952,489, filed on Nov. 25, 2015, now Pat. No. 9,679,614.

(51) Int. Cl.
| | |
|---|---|
| G11C 5/02 | (2006.01) |
| G11C 7/06 | (2006.01) |
| G11C 5/06 | (2006.01) |
| G11C 11/4091 | (2006.01) |
| G11C 11/4094 | (2006.01) |
| G11C 11/4096 | (2006.01) |
| G11C 11/408 | (2006.01) |
| G11C 7/10 | (2006.01) |

(52) U.S. Cl.
CPC .............. *G11C 5/025* (2013.01); *G11C 5/063* (2013.01); *G11C 11/4091* (2013.01); *G11C 11/4094* (2013.01); *G11C 7/06* (2013.01); *G11C 7/1048* (2013.01); *G11C 11/4085* (2013.01); *G11C 11/4096* (2013.01)

(58) Field of Classification Search
CPC ......... G11C 5/025; G11C 7/06; G11C 7/1048; G11C 11/4091; G11C 11/4085; G11C 11/4096; G11C 11/4094; G11C 5/063
See application file for complete search history.

(56) References Cited

U.S. PATENT DOCUMENTS

| | | | |
|---|---|---|---|
| 5,432,736 A | * | 7/1995 | Wong ..................... G11C 11/41 365/154 |
| 8,259,509 B2 | | 9/2012 | Rao et al. |
| 9,679,614 B1 | | 6/2017 | Matsui |
| 2006/0171225 A1 | | 8/2006 | Chol et al. |
| 2010/0039871 A1 | | 2/2010 | Rao et al. |
| 2011/0199840 A1 | | 8/2011 | Kajigaya |
| 2017/0143499 A1 | | 5/2017 | Matsui |

* cited by examiner

*Primary Examiner* — Harry W Byrne
*Assistant Examiner* — Ajay Ojha
(74) *Attorney, Agent, or Firm* — Dorsey & Whitney LLP

(57) ABSTRACT

Apparatuses included a single-ended main input/output line in a semiconductor device are described. An example apparatus includes: a pair of differential data lines coupled to a sense amplifier; a single-ended data line; a first transistor coupled between the one of the pair of differential data lines and the power line and coupled to the single-ended data line at a control node thereof; a second transistor coupled between the single-ended data line and the power line and coupled to the one of the pair of differential data lines at a control node thereof; and a third transistor coupled between the single-ended data line and the other of the pair of differential data lines.

20 Claims, 12 Drawing Sheets

SEMICONDUCTOR DEVICE WITH SINGLE ENDED MAIN I/O LINE

CROSS-REFERENCE TO RELATED APPLICATIONS

This application is a continuation of U.S. application Ser. No. 14/952,489 filed Nov. 25, 2015, which is incorporated herein by reference, in its entirety, for any purpose.

BACKGROUND

High data reliability, high speed of memory access, and reduce (chip size are features that are demanded from semiconductor memory.

Operation frequency of low-power dynamic random-access memory (LPDRAM) has doubled for each generation, and the data (e.g., prefetch) to be simultaneously accessed by a READ command or a WRITE command has also doubled as in the operation frequency. For example, in the case of a low-power double data rate 3 (LPDDR3) type synchronous DRAM (SDRAM) with an operation frequency of 1.6 Gbps and a word line having a word length of 1 Kb (=1024 bits), sixty-four bits are read from the word line in a READ operation, and sixty-four bits are written in one WRITE operation; however, the latest low-power SDRAM, such as a low-power double data rate 4 (LPDDR4) type facilitates 128 bits data access through a word line having a word length of 1 KB.

Such low-power type memory may have a general three-layered metal configuration. Metal wires of lower layers can be used as wires which have the same pitch as memory cells. For example, metal wires on the first layer of lower layers may be used for column select signals (YS) and metal wires on the second layer of the lower layers may be used for main word lines. Main input/output lines (MIO) may be metal wires, such as the third level aluminum interconnection (3AL), on the uppermost layer in order to couple peripheral read amplifiers and write buffer circuits to local IO lines (LIO) within the array. Due to the doubling of data provided per access, more metal wires may be included on the uppermost layer. The uppermost layer may also include power supply lines to distribute power supplies to all over the memory. Due to the increased number of wires for data access, the width of metal wires for the power supply may be reduced. This reduction of the width of metal wires for the power supply may result in deteriorating an operation margin due to a decrease of a power level when multiple operations are executed simultaneously.

DTAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
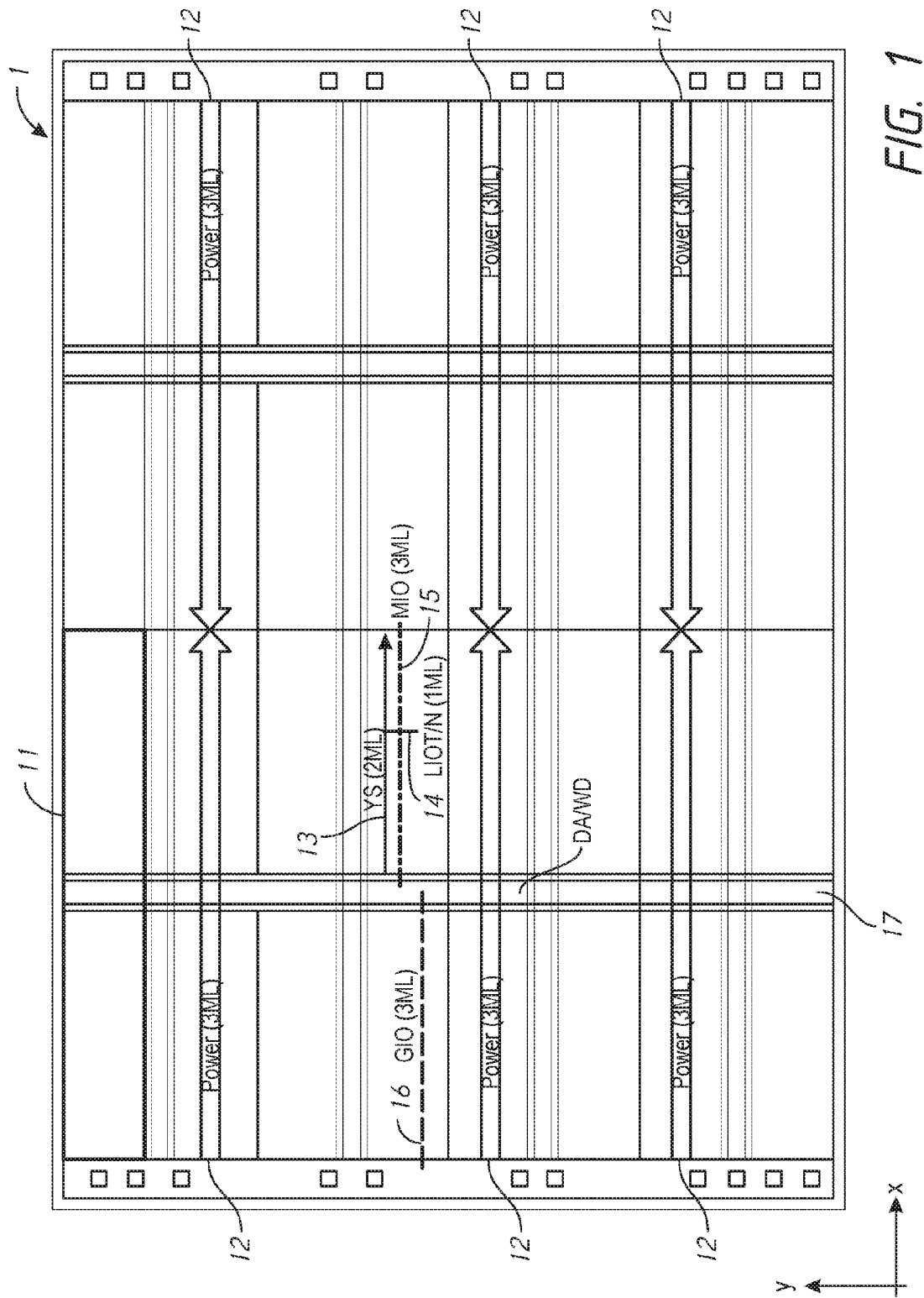
FIG. 1 is a wiring diagram of memory arrays in a semiconductor device according to an embodiment of the present disclosure.

FIG. 1 is a wiring diagram of memory arrays in a semiconductor device according to an embodiment of the present disclosure. For example, the semiconductor device 1 may be an LPDRAM chip including a plurality of banks 11 and having a multi-level wiring structure formed above a semiconductor substrate. The multi-level wiring structure includes a first metal wiring layer (1ML), a second metal wiring layer (2ML) and a third metal wiring layer (3ML) which are formed from the bottom to the top, with insulating layers between the metal wiring layers. Each wiring in FIG. 1 is formed from a wiring layer shown in parentheses accompanying each wiring. For example, power lines 12 are formed from the third metal wiring layer (3ML) for supplying power supply voltages from power supply pads throughout the semiconductor device. Column select signal lines (YS) 13 may be formed from the second metal wiring layer (2ML) and may transmit column select signals. Hierarchical input/output (I/O) structure for data access includes a pair of local input/output lines (LIOT/Ns) 14 from the first metal wiring layer (1ML), main input/output lines (MIOs) 15 and global input/output lines (GIOs) 16 from the third metal wiring layer (3ML). Combinations of a read data amplifier (DA) and a write driver (WD) 17 are coupled to their respective GIOs and MIOs.

Figure 2:
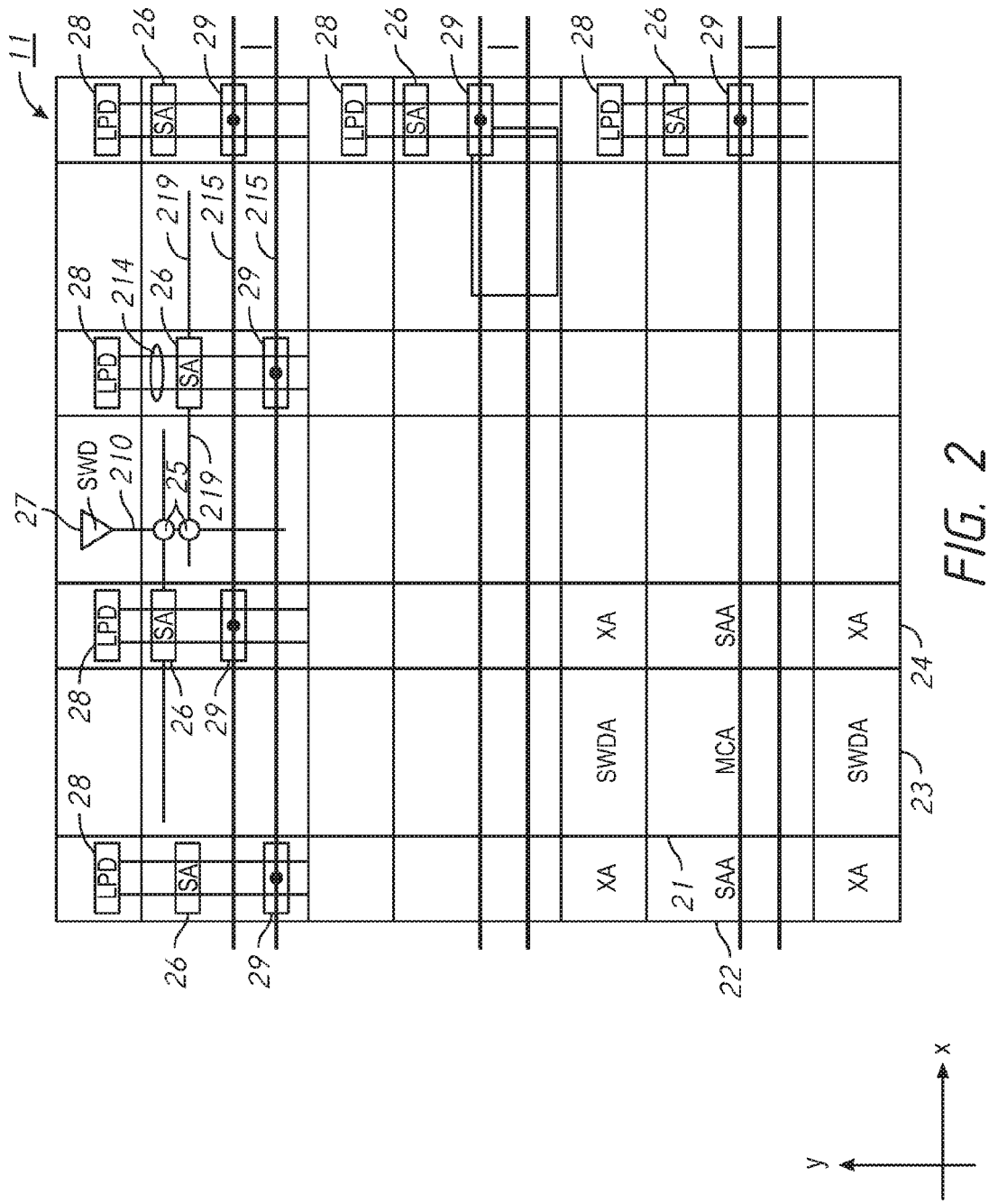
FIG. 2 is a schematic diagram of a portion of a bank of FIG. 1.

FIG. 2 is a schematic diagram of a portion of a bank of FIG. 1. As shown in FIG. 2, each bank 11 includes a plurality of memory cell arrays (MCA) 21, a plurality of sense amplifier arrays (SAA) 22, a plurality of sub-word line driver arrays (SWDA) 23 and a plurality cross areas (XA) 24. For example, each memory cell array 21 includes a plurality of memory cells 25. Each memory cell is located at an intersection of a word line (WL) 210 and one of a pair of bit lines (e.g., BLT and BLN) 219 and coupled to the word line 210 and the one of the pair of bit lines 219. The plurality of memory cells 25 may be activated by the selection of the word line WL by a row decoder (not shown) and the selection of the bit line by a column decoder (not shown). Each sense amplifier array (SAA) 22 includes a plurality of sense amplifier circuits (SA) 26. Each sense amplifier 26 is coupled to the memory cells 25 via the pair of bit lines (e.g., BLT and BLN) 219. Each sense amplifier 26 is also coupled to other components via a differential pair of local input/output lines LIOT/N 214 which may be the pair of local input/output lines (LIOT/N) 14 of FIG. 1. Sub amplifiers (SubA) 29 may also be located in the sense amplifier array SAA 22. The differential pairs of local input/output lines (LIOT/N) 214 are coupled to main input/output lines (MIO) 215 via the respective sub amplifier 29. The main input/output lines (MIO) 215 may be the main input/output line (MIO) 15 in FIG. 1. Each sub-word line driver array 23 includes sub-word line drivers (SWD) 27 coupled to memory cells via the word lines (WL) 210. Each cross area 24 includes at least one local input/output precharge and drive circuit (LPD)) 28 coupled to the differential pairs of local input/output lines (LIOT/N) 214 for precharging, and driving the differential pairs of local input/output lines (LIOT/N) 214. Connections between elements in these arrays will be explained in detail later in this disclosure.

Figure 3:
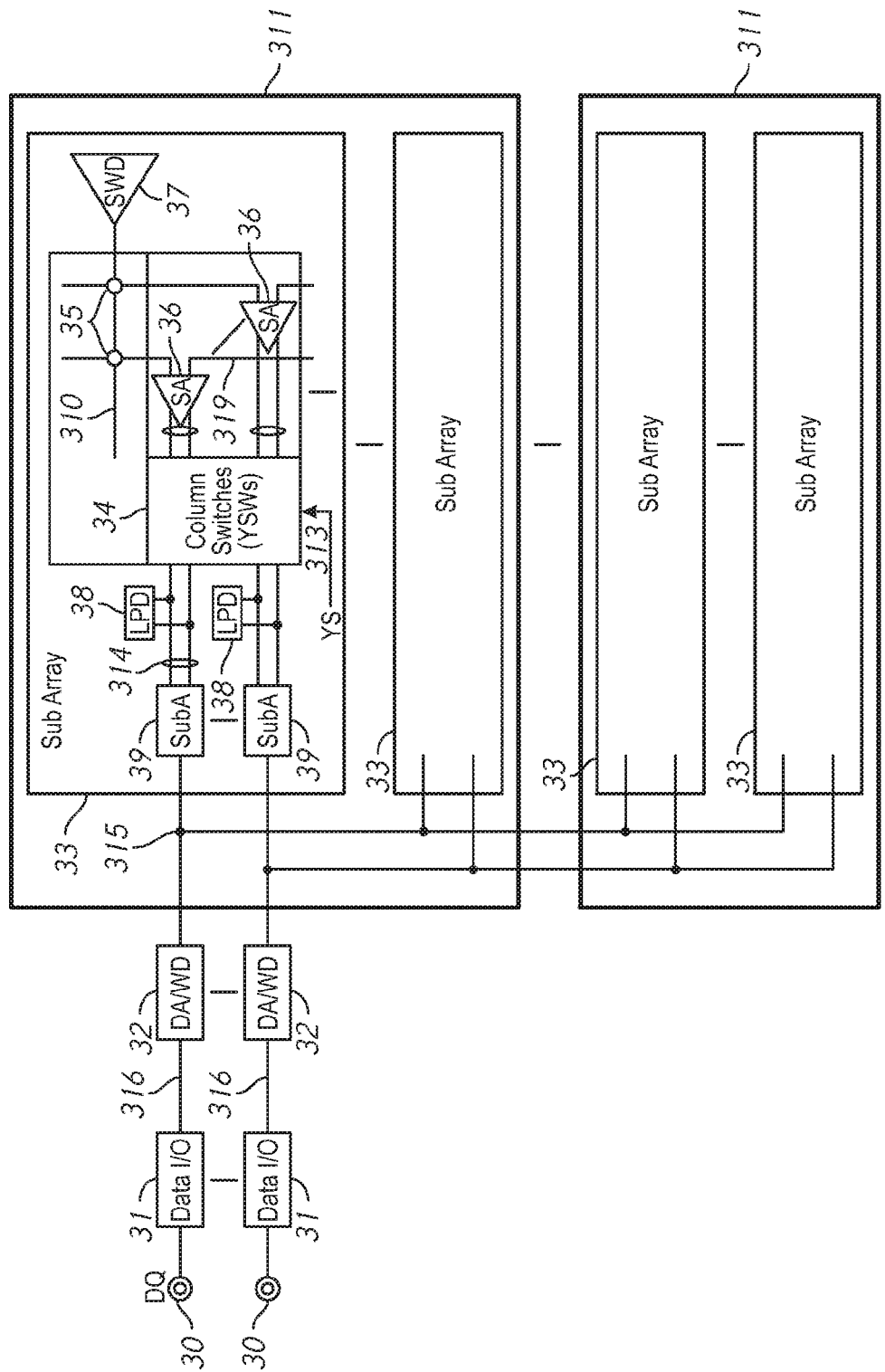
FIG. 3 is a schematic diagram of data signal paths and the interconnections among a plurality of memory banks, according to an embodiment of the present disclosure.

FIG. 3 is a schematic diagram of data signal paths and the interconnections among a plurality of memory banks, according to an embodiment of the present disclosure. A combination of a data amplifier circuit (DA) and a write driver (WD) 32 shown as DA/WD in FIG. 3 is shared by respective sub arrays 33 of a plurality of memory banks 311 coupled by a single-ended main input/output line (MIO) 315. Each memory bank 311 includes a plurality of sub arrays 33. Each sub array 33 includes a group of memory cell arrays and their related circuits, such as sense amplifiers SAs 36, a plurality of column select switches (YSWs) 34, and the like. The group of memory cell arrays in each sub array 33 may be simultaneously activated for a single memory operation, such as a read operation, a write operation and the like. For example, each sub array corresponds to a respective column of memory cell arrays 21 in FIG. 2. The plurality of column switches YSWs 34 are coupled between differential pairs of local input/output lines (LIOT/N) 314 and pairs of bit lines (BLT/N) 319. In particular, the column switches (YSWs) 34 are separated into a plurality of sets. The column switches 34 of each set are coupled in common to a respective differential pair of LIOT/N 314 at one end, and each column switch 34 is coupled a respective pair of BLT/N 319 at the other end. In other words, each set of column switches 34 is configured to couple a selected one of respective pairs of BLT/N 319 to a respective differential pair of LIOT/N 314. Each column switch 34 is turned on or off responsive to a respective column select signal YS 313. Functionalities of local input/output precharge and drive circuits (LPD)) 38, sub amplifiers (SubA) 39 and the combination of a data amplifier circuit (DA) and a write driver (WD) 32 will be explained in detail later in this disclosure.

In FIG. 3, data retrieved from a selected memory cell 35 is transferred to a DQ terminal 30 through one of a pair of BLT/N 319, a sense amplifier circuit SA 36, a differential pair of LIOT/N 314, a sub-amplifier circuit (SubA) 39, the single-ended MIO 315, a read data amplifier circuit DA in a DA/WD 32, a single-ended global input/output line (GIO) 316 and a data input/output circuit (Data I/O) 31. Similarly, data to be written to a selected memory cell is transferred from the DQ terminal 30 through the data I/O 31, the single-ended GIO 316, a write driver (WD) in the DA/WD 32, the single-ended MIO 315, the sub-amplifier circuit SubA 39, the differential pair of LIOT/N 314, the sense amplifier circuit SA 36, and through one of a pair of BLT/N 319. Please note that the single-ended GIO 316 shown in FIG. 3 merely is an example. In other embodiments, a differential pair of GIO may be used.

Figure 4:
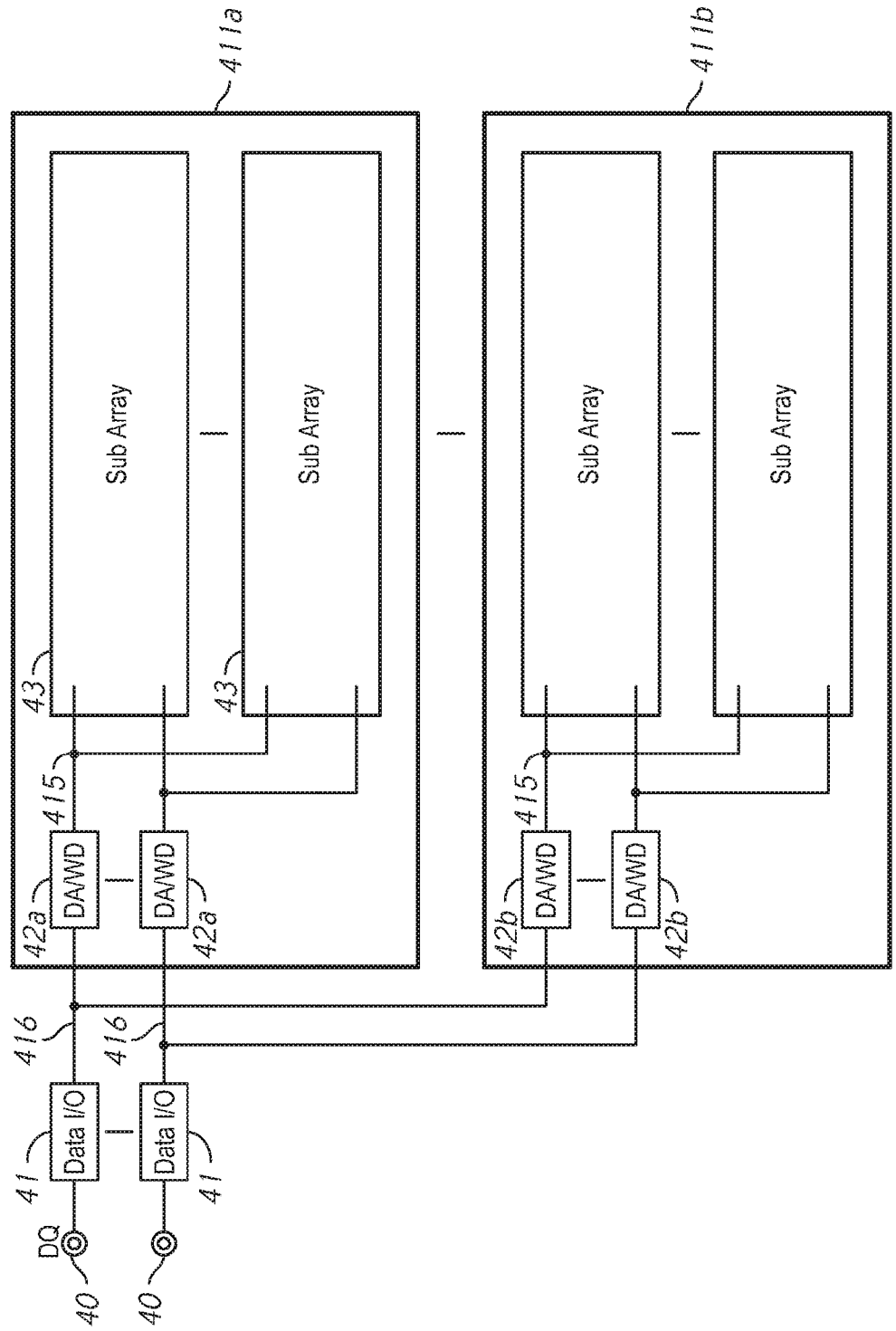
FIG. 4 is a schematic diagram of data signal paths and the interconnections among a plurality of memory banks, according to an embodiment of the present disclosure.

FIG. 4 is a schematic diagram of data signal paths and the interconnections among a plurality of memory banks, according to an embodiment of the present disclosure. In FIG. 4, memory banks 411a and 411b have their respective DA/WD 42a, 42b, instead of sharing the DA/WA 32 among the plurality of banks 31 as in FIG. 3. The circuits of the embodiment of FIG. 4, other than the DA/WD 32 for each bank, are the same as in FIG. 3. For example, data retrieved from a selected memory cell (not shown) on a sub array 43 in a bank 411a is transferred to a DQ terminal 40 through a single-ended MIO 415, a read data amplifier circuit DA in a DA/WD 42a in the bank 411a, a single-ended global input/output line (GIO) 416 and a data input-'output circuit (Data I/O) 41. Similarly, data to be written to a selected memory cell is transferred from the DQ terminal 40 through the data I/O 41, the single-ended GIO 416, a write driver (WD) in the DA/WD 42a in the bank 411a, and the single-ended MIO 415.

Figure 5:
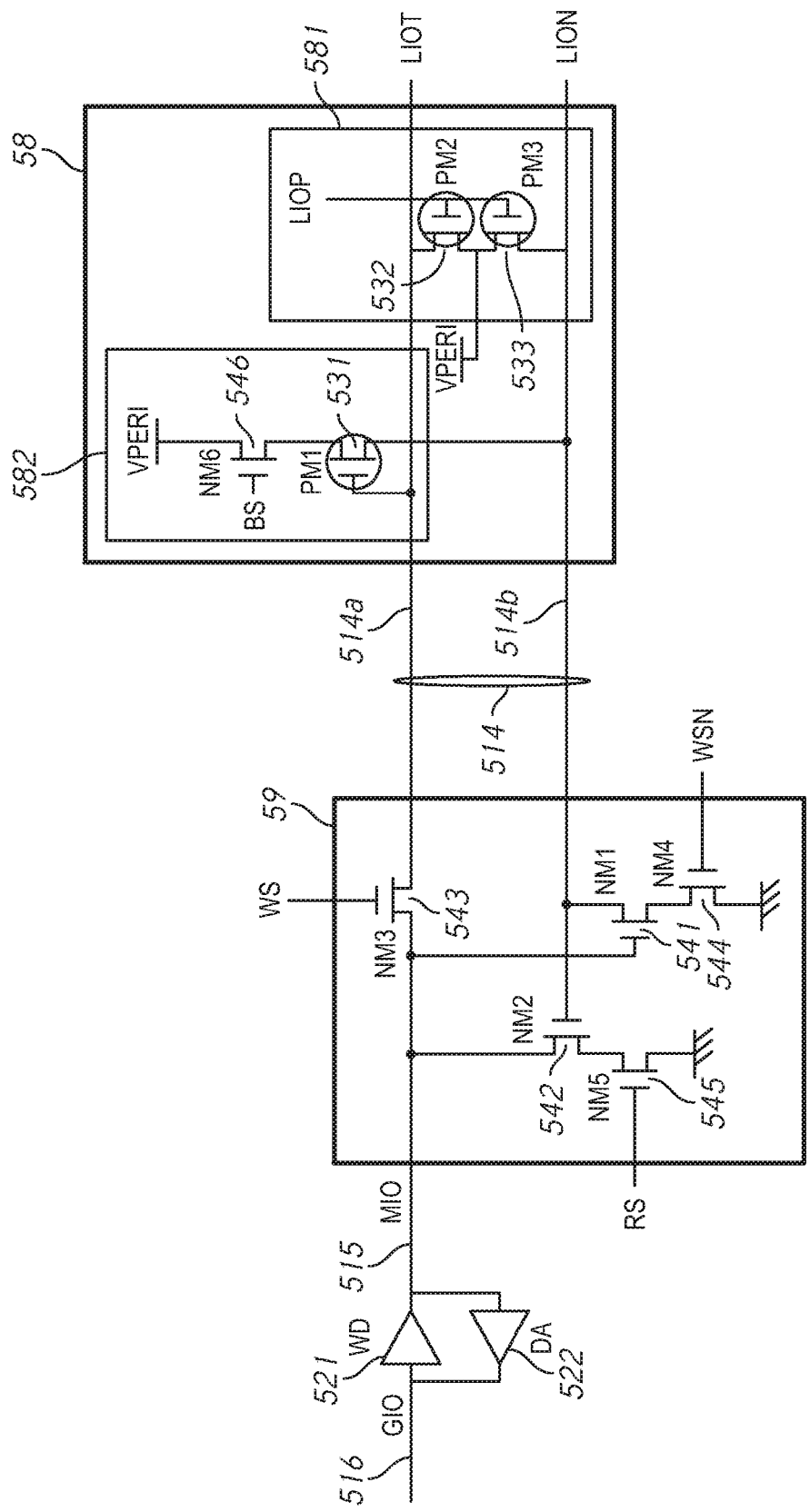
FIG. 5 is a circuit diagram of a signal path between a single-ended global input/output line and a differential pair of local input/output lines according to an embodiment of the present disclosure.

FIG. 5 is a circuit diagram of a signal path between a single-ended global input/output line and a differential pair of local input/output lines according to an embodiment of the present disclosure. A sub amplifier circuit 59 is coupled to a single-ended main input/output line (MIO) 515 at one end and a differential pair of local input/output lines (LIOT/N) 514 at the other end. The sub amplifier circuit 59 provides a bidirectional interface between the MIO 515 and the LIOT/N 514. A local input/output (LIO) precharge and drive circuit (LPD) 58 includes a LIO precharge circuit 581 and a LIO driver circuit 582 The LIO precharge circuit 581 includes a P-channel transistor PM2 532 and a P-channel transistor PM3 533 which may precharge differential pair of local input/output lines (LIOT/N) 514 to an internal voltage VPERI responsive to a precharge signal LIOP for the LIOT/N 514. The LIO driver circuit 582 may include an N-channel transistor (NM6) 546 and a P-channel transistor (PM1) 531. The NM6 546 is coupled between the internal voltage supply VPERI and the PM1 531 and includes a control node which receives a bias signal BS. The PM1 531 is coupled between the NM6 546 and an LION 514b and includes a control node which receives a signal from an LIOT 514a. The NM6 546 prevents the PM1 531 from latching up during an initial operation. The NM6 546 may be also used for turning off the PM1 531 during a normal operation. The usage of the PM1 531 may be optional.

Figures 6A, 6B:
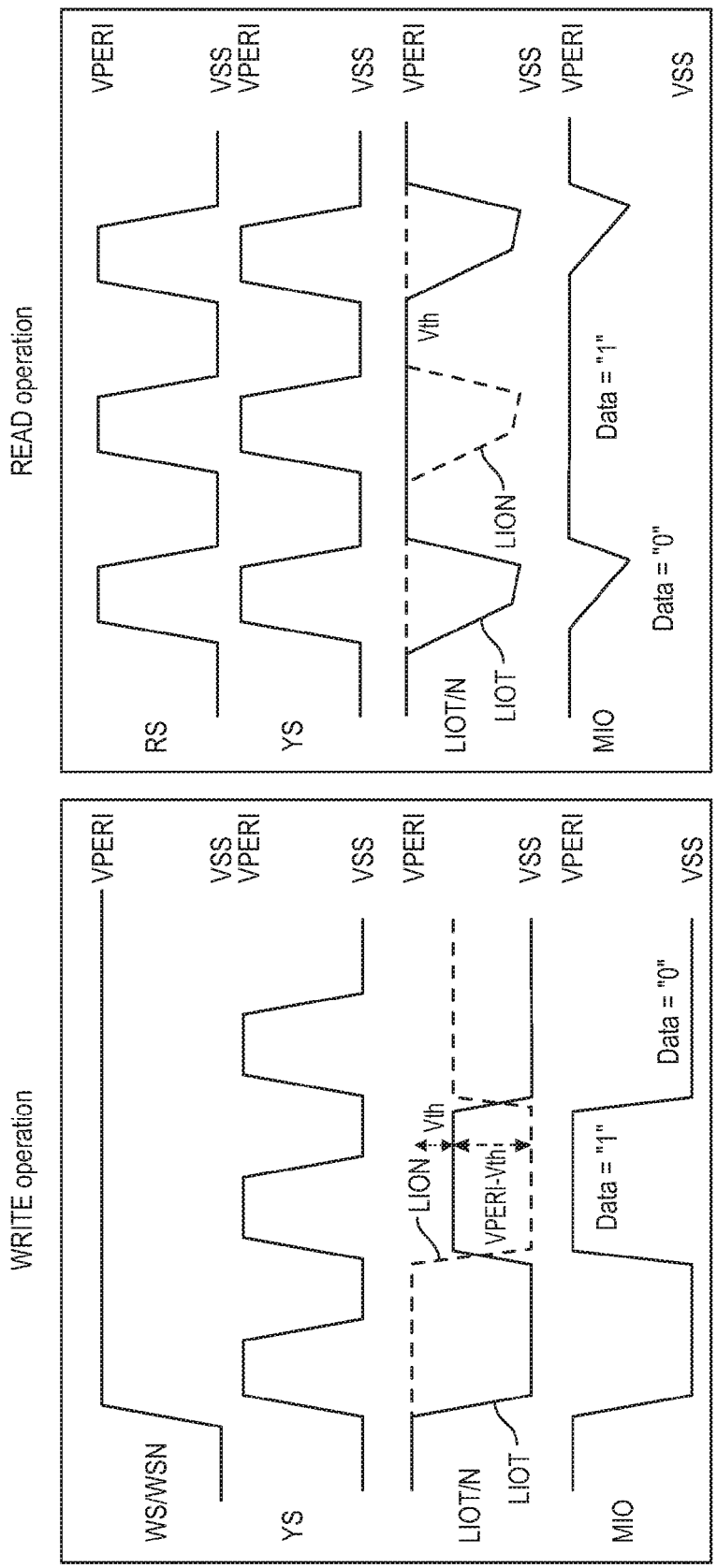
FIG. 6A is a timing diagram of a write operation of the signal path in FIG. 5.
FIG. 6B is a timing diagram of a read operation of the signal path in FIG. 5.

FIG. 6A is a timing diagram of a write operation of the signal path in FIG. 5. Please note that three pulses of YS in FIG. 6A may include activation of different column switches YSW. In other words, different sense amplifiers may be coupled to the LIOT/N 514 responsive to each activation of the YS signal. In a write operation, a first write signal WS and a second write signal WSN are activated and a signal from the single-ended global input/output line (GIO) 516 is provided to a write driver (WD) 521. In this embodiment, the first write signal WS and the second write signal WSN may be activated and deactivated simultaneously.

While the first write signal WS and the second write signal WSN are active, the sub amplifier circuit 59 may change a voltage level of the differential pair of local input/output lines (LIOT/N) 514 responsive to a voltage level of the single-ended main input/output line (MIO) 515 from the write driver (WD) 521. The sub amplifier circuit 59 may include a N-channel transistor (NM1) 541 coupled between the LION 514b and a power line (e.g., ground) and has a control node coupled to the MIO 515. The sub amplifier circuit 59 further includes an N-channel transistor (NM3) 543 coupled between the MIO 515 and the LIOT 514a and has a control node coupled to the first write signal WS. The sub amplifier circuit 59 may further include an N-channel transistor (NM4) 544 coupled between the NM1 541 and the power line that has a control node coupled to the second write signal WSN. During the write operation, the NM3 543 receives the first write signal WS at its control node and the NM4 receives the second write signal WSN at its control node. Thus, the NM4 may assist discharging the LION 514b in the write operation and may prevent the discharging of the LION 514b during other operations. In case of writing data "1", the N-channel transistor (NM3) 543 may transfer a logic high of the MIO 515 to an LIOT 514a while the NM1 541 may discharge the LION 514b to a logic low. In this embodiment, a voltage level of the LIOT 514a may increase to (VPERI-Vth) where Vth represents a threshold voltage of the NM3 543 because an active level of the first write signal WS is an internal voltage VPERI. In case of writing data "0", the NM3 543 may transfer a logic low from the MIO 515 to the LIOT 514a through the NM3 543 while the NM1 541 is turned off. In this case, the LIO drive circuit 582 including the PM1 531 may drive the LION 514b to the logic high responsive to the logic low of the LIOT 514a. In this embodiment, a voltage level of the LION 514b may increase to "VPERI-Vth" where Vth represents a threshold voltage of the NM6 546 because an active level of a bias signal BS is VPERI in this embodiment.

FIG. 6B is a timing diagram of a read operation of the signal path in FIG. 5. In a read operation, data is transmitted from a memory cell (not shown in FIG. 5) via the differential pair of local input/output lines (LIOT/N) 514. The sub amplifier circuit 59 may include an N-channel transistor (NM2) 542 coupled between the MIO 515 and the power line and has a control node coupled to the LION 514b. In this embodiment, a read signal RS provided to an N-channel transistor (NM5) 545 that is coupled between the NM2 542 and the power line. Each of the read signal RS and a column select signal YS may be activated in response to a read command in the read operation. When the NM5 545 receives the active read signal RS, the sub amplifier circuit 59 may change a voltage level of the single-ended main input/output line (MIO) 515 responsive to a voltage level of the differential pair of local input/output lines (LIOT/N) 514. Please note that three pulses of YS in FIG. 6B may include activation of different column switches YSW. In other words, different sense amplifiers may be coupled to the LIOT/N 514 responsive to each activation of the YS signal. The MIO 515 may be precharged to a logic high (e.g., VPERI) before starting the read operation. In case of reading data "0", the NM2 542 may discharge the MIO 515 responsive to the logic high (VPERI) of the LION 514b. As a result, the MIO 515 may become the logic low. In case of reading data "1", the NM2 542 is turned off because the LION 514b takes the logic low. As a result, the MIO may maintain the precharge voltage, which is the logic high.

Please note that the sub amplifier circuit 59 shown in FIG. 5 merely is an example. In other embodiments, different sub amplifier circuits may be used. For example, some P channel transistors may be used as in the sub amplifier circuit 59 instead of and/or additional to the N-channel transistors in FIG. 5.

Figure 7:
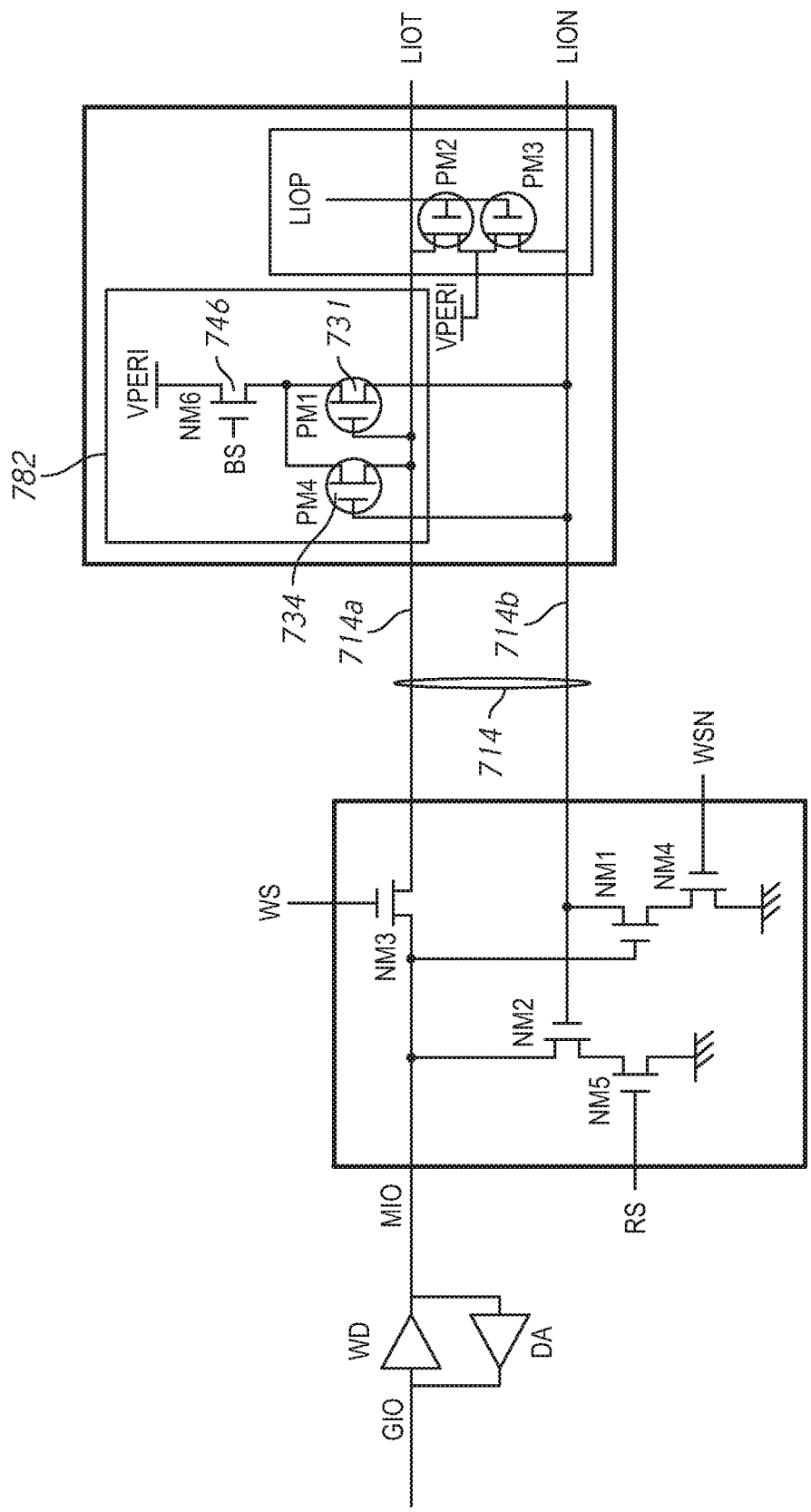
FIG. 7 is a circuit diagram of a signal path between a single-ended global input/output line and a differential pair of local input/output lines according to an embodiment of the present disclosure.

FIG. 7 is a circuit diagram of a signal path between a single-ended global input/output line and a differential pair of local input/output lines according to an embodiment of the present disclosure. Description of components corresponding to components included in FIG. 5 will not be repeated. An LIO driver circuit 782 may include a P-channel transistor (PM4) 734 that is coupled between the NM6 746 and an LION 714a and includes a control node which receives a signal from an LION 514b. In this configuration, the LIO drive circuit 782 including the PM4 734 may drive the LIOT 714a to the logic high responsive to the logic low of the LION 714b. Thus, the PM4 734 may accelerate a change of the voltage level of the LIOT 714a while writing data "1".

Figure 8:
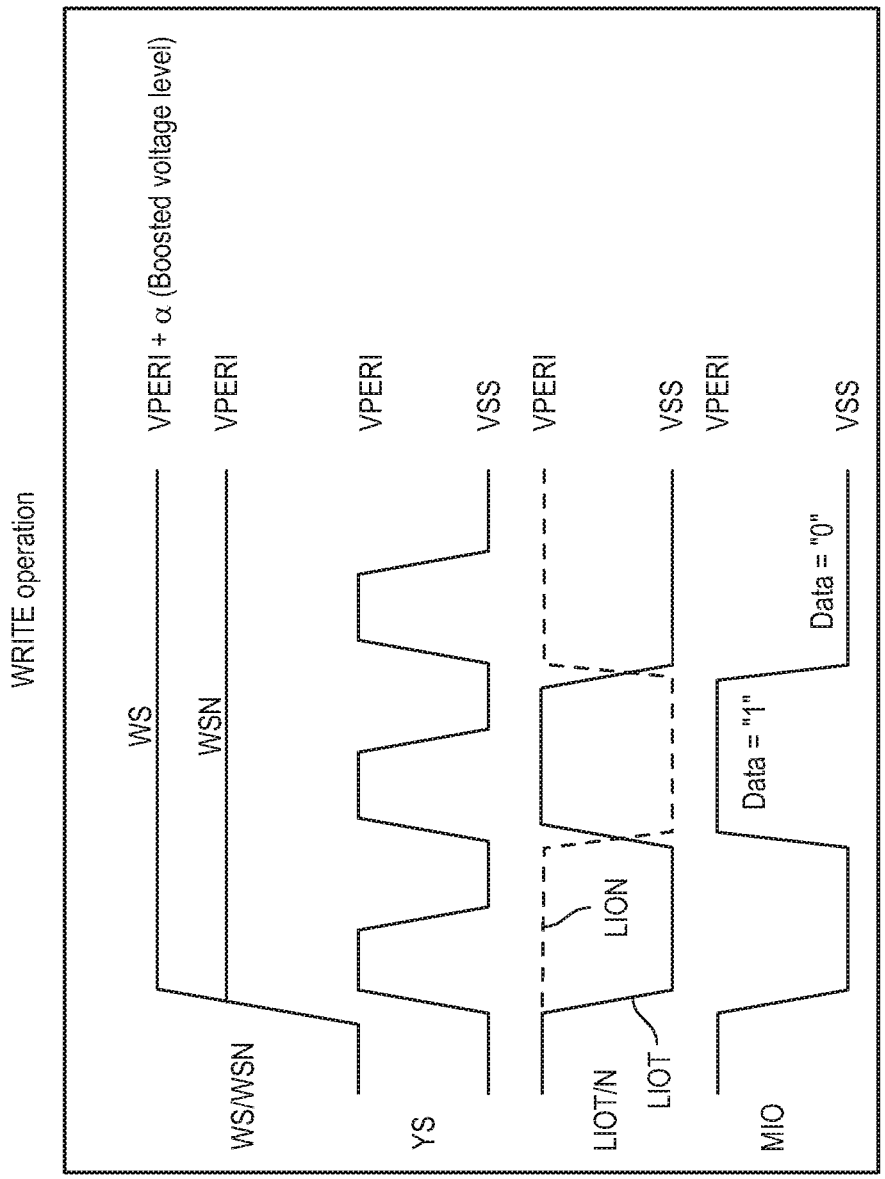
FIG. 8 is a timing diagram of a write operation of the signal path according to another embodiment of FIG. 5.

FIG. 8 is a timing diagram of a write operation of the signal path according to another embodiment of FIG. 5. When the NM3 543 and the NM6 546 have a greater thickness of a gate insulating film than a thickness of other N-channel transistors, such as NM1 541, NM2 542, NM4 544, and NM5 545, the NM3 543 and NM6 546 may receive a boosted voltage as an active level of the write signal WS and a level of bias signal BS (e.g., WS at least VPERI+Vt (543), where Vt (543) is the threshold voltage of NM3 543; BS at least VPERI+Vt (546), where Vt (546) is the threshold voltage of NM6 546), respectively, For example, the gate insulating film may be a gate oxide film. As a result, a voltage level of the LIOT 514a and a voltage level of the LION 514b may increase to the internal voltage VPERI. Please note that three pulses of YS in FIG. 8 may include activation of different column switches YSW one another. In other words, different sense amplifiers may be coupled to the LIOT/N 814 responsive to each activation of the YS signal. In this embodiment, the first write signal WS provided to the NMS 543 may have a boosted voltage level "VPERI+α" as a logic high while the second write signal WSN provided to the NM4 544 may still have a voltage level VPERI. Thus, unlike signals on LIOT and LION 514b in FIG. 6A, the signals on LIOT and LION in FIG. 8 may have a voltage level VPERI as the logic high. In this embodiment, the NM6 546 may be used for preventing the PM1 531 from latching up during initial operation; however, the NM46 546 may not be used for turning off the PM1 531.

Figure 9:
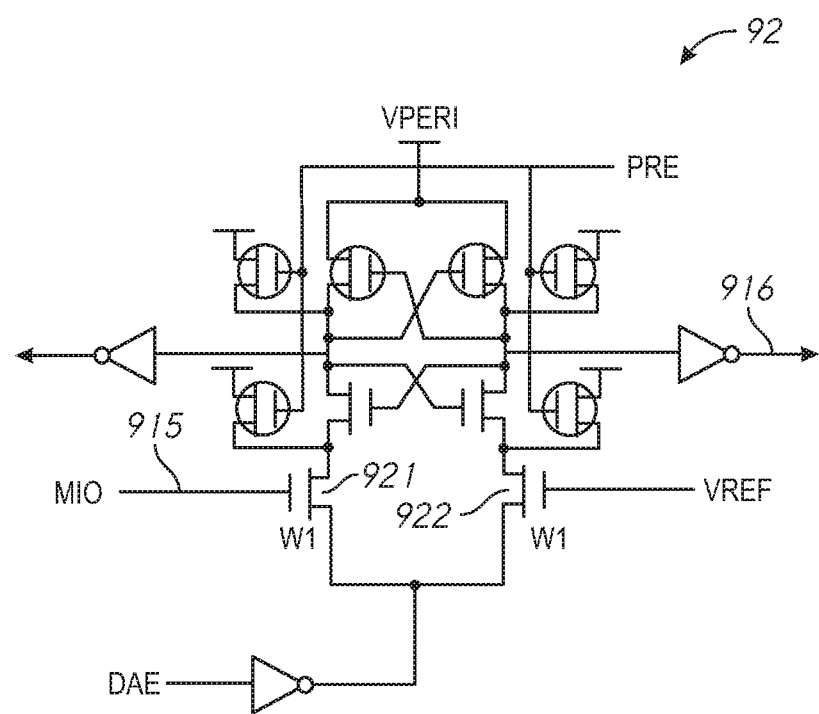
FIG. 9 is a circuit diagram of a data amplifier circuit according to an embodiment of the present disclosure.

FIG. 9 is a circuit diagram of a data amplifier circuit according to an embodiment of the present disclosure. For example, the data amplifier circuit (DA) 92 may include a differential amplifier circuit as depicted in FIG. 9, which may be any of the data amplifier circuits (DA) previously described in the present disclosure. The data amplifier circuit 92 receives a data amplifier enable signal (DAE), and responsive to the DAE signal, the data amplifier circuit 92 is enabled. An input node the data amplifier circuit 92 is coupled to a single-ended main input/output line (MIO) 915. The enabled data amplifier circuit 92 amplifies read data from the MIO 915 and provides the amplified data to a global input/output line (GIO) 916. In this embodiment, the data amplifier 92 may include two input transistors 921 and 922. A first input transistor 921 has a control node coupled to the MIO 915. A second input transistor 922 has a control node that receives a reference voltage (VREF). For example, the reference voltage (VREF) may be about a half of the VPERI. At least one of output nodes of the data amplifier circuit 92 is coupled to a DQ terminal, such as the DQ terminal 30 of FIG. 3 or the DQ terminal 40 of FIG. 4, via the GIO 916.

Figure 10:
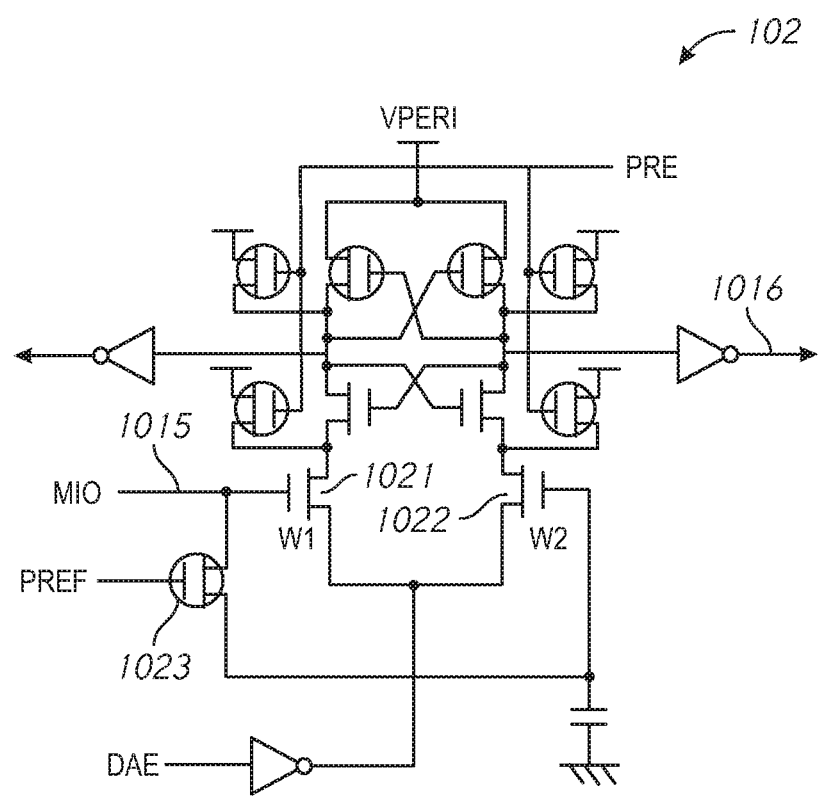
FIG. 10 is a circuit diagram of a data amplifier circuit according to an embodiment of the present disclosure.

FIG. 10 is a circuit diagram of a data amplifier circuit according to an embodiment of the present disclosure. For example, the data amplifier circuit (DA) 102 may include the differential amplifier circuit. In FIG. 10, control nodes of two input transistors 1021 and 1022 are coupled in common to the single-ended MIO 1015. For example, the control node of the second input transistor 1022 is coupled to the single-ended MIO 1015 with an intervention of a pass gate transistor 1023 therebetween, instead of using the reference voltage VREF as in FIG. 9. The pass gate transistor 1023 receives a precharge signal PREF at a gate. The pass gate transistor 1023 turns off responsive to a deactivation of the precharge signal PREF before an activation of the data amplifier enable signal DAE that occurs at a substantially same time when the MO 1015 may be released from a precharged state. In particular, the precharge signal PREF may be re-activated after the data amplifier circuit 102 starts a preparation operation for a next read cycle. It may be possible to restart precharging the control nodes of two input transistors 1021 and 1022 because the data amplifier circuit 102 is able to latch a current data subject to amplification once the data amplifier circuit 102 starts the preparation operation.

In addition, the two input transistors 1021 and 1022 may be different in size from each other, in particular in FIG. 10, which may facilitate reading data (e.g., "1"). For example, a channel width W1 of the first input transistor 1021 may be greater than a channel width W2 of the second input transistor 1021 CW1>W2).

Figure 11:
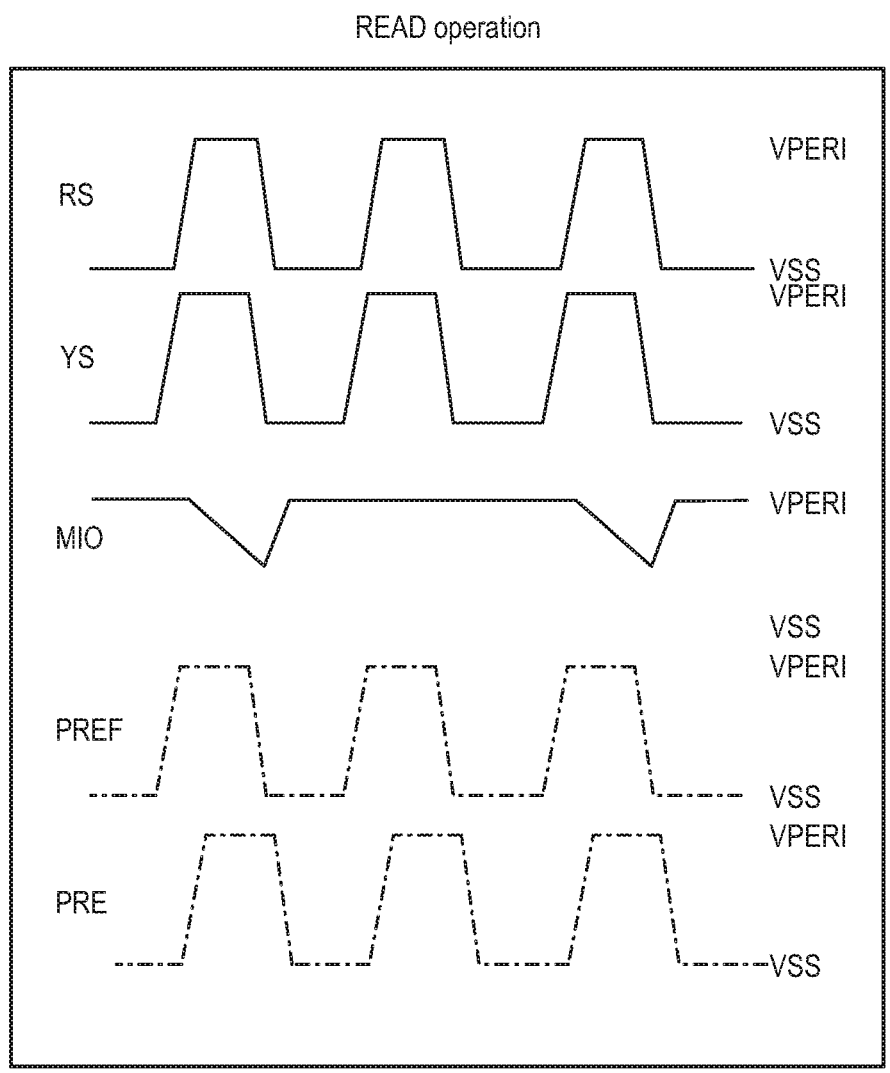
FIG. 11 is a timing diagram of a read operation of the data amplifier of FIG. 10.

FIG. 11 is a timing diagram of a read operation of the data amplifier of FIG. 10. As shown FIG. 11, the single-ended MIO 1015 is precharged to a level of the internal voltage VPERI by a precharge circuit in a write driver WD (e.g., the WD 521 in FIG. 5) before starting a read operation. The precharging operation of the single-ended MIO 1015 may results in precharging the control nodes of the two input transistors 1021 and 1022 to the same voltage level VPERI. While reading data "1", there may be no voltage change on the single-ended MIO 1015 because the single-ended MIO 1015 may keep the VPERI level from the precharge operation when the data "1" is read out. As mentioned above, the two inputs of the data amplifier circuit 102, such as the control nodes (e.g., gates) of the two input transistors 1021 and 1022, also keep the level of the internal voltage VPERI. Therefore, the data amplifier circuit 102 may struggle to amplify the data 1 if the two input transistors 1021 and 1022 are equal in size to each other because two inputs are the same voltage level. As previously described, the two input transistors 1021 and 1022 may have a different size from each other to facilitate reading of the data.

Figures 12A, 12B:
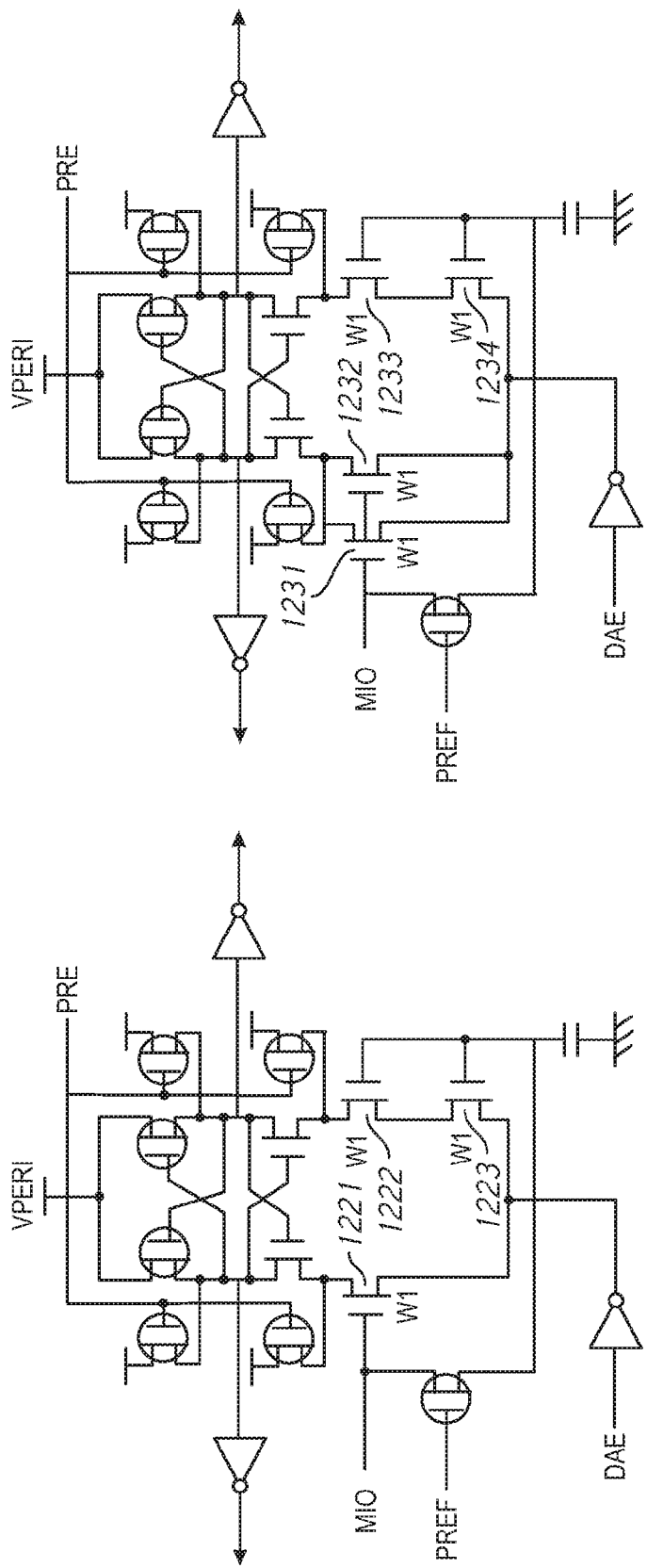
FIGS. 12A and 12B are circuit diagrams of data amplifier circuits according to embodiments of the present disclosure.

FIGS. 12A and 12B are circuit diagrams of data amplifier circuits according to embodiments of the present disclosure, The data amplifier circuits in FIGS. 12A and 12B are variations of input transistors having different sizes, one size from one side where control nodes of the input transistors receive a data signal from the MIO directly and the other size from the other side where control nodes of the input transistors receive the data signal from the MIO via a pass gate transistor. In FIG. 12A, a channel length of a first transistor 1221 may be smaller than an effective channel length of a combination of two transistors 1222 and 1223 connected in series. In FIG. 12B, an effective channel width of a combination of first transistors 1231 and 1232 becomes larger than the channel width of the first transistor 1221 in FIG. 12A by having the first transistors 1231 and 1232 connected in parallel.

As shown in FIGS. 10, 12A and 12B, one or more first input transistors which directly receive a data signal from a single-ended MIO may operate faster than one or more second input transistors coupled to a pass gate transistor which receives the data signal from the single-ended MIO in decreasing a drain voltage while reading data "1". Thus, a data amplifier circuit including the one or more first input transistors and the one or more second input transistors of FIGS. 10, 12A and 12B may be able to correctly amplify the data 1.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a pair of bit lines coupled to a plurality of memory cells;
   a sense amplifier circuit coupled to the pair of bit lines;
   a pair of differential data lines coupled to the sense amplifier;
   a single-ended data line;
   a first transistor coupled between a first power line supplied with a first voltage and one of the pair of differential data lines and coupled to the other of the pair of differential data lines at a control node thereof; and
   a second transistor coupled between a second power line supplied with a second voltage different from the first voltage and the one of the pair of differential data lines and coupled to the single-ended data line at a control node thereof.

2. The apparatus of claim 1, further comprising a third transistor between the other of the pair of differential data lines and the single-ended data line and a fourth transistor between the second transistor and the second power line.

3. The apparatus of claim 2, wherein the third transistor and the fourth transistor are configured to be turned on in a write operation.

4. The apparatus of claim 1., further comprising a precharge circuit configured to precharge the pair of differential data lines to the first voltage.

5. The apparatus of claim 1, further comprising a third transistor coupled between the first power line and the other of the pair of differential data lines and coupled to the one of the pair of differential data lines at a control node thereof.

6. The apparatus of claim 2, wherein the third transistor is an N-channel transistor and the first voltage is supplied at the control node of the third transistor as the control signal in a write operation.

7. An apparatus comprising:
   a pair of bit lines coupled to a plurality of memory cells;
   a sense amplifier circuit coupled to the pair of bit lines;
   a pair of differential data lines coupled to the sense amplifier;
   a single-ended data line; and a first transistor coupled between one of the pair of differential data lines and the single-ended data line, the first transistor receiving a control signal at a control node thereof; and a second transistor coupled between a first power line supplied with a first voltage and the single-ended data line and coupled to the other of the pair of differential data lines at a control node thereof.

8. The apparatus of claim 7, further comprising a third transistor coupled between the first power line and the second transistor.

9. The apparatus of claim 8, wherein the third transistor is configured to he turned on in a read operation.

10. The apparatus of claim 9 wherein the first transistor is configured to be turned on in the write operation.

11. The apparatus of claim 7, further comprising a precharge circuit configured to precharge the pair of differential data lines to the first voltage.

12. The apparatus of claim 8, further comprising:
   a fourth transistor coupled between a second power line supplied with a second voltage different from the first voltage and the other of the pair of differential data lines and coupled to the one of the pair of differential data lines at a control node thereof; and
   a fifth transistor coupled between the first power line and the other of the pair of differential data lines and coupled to the single-ended data line at a control node thereof.

13. The apparatus of claim 12, further comprising a sixth transistor coupled between the first power line and the fifth transistor, the sixth transistor receiving an additional control signal at a control node thereof.

14. The apparatus of claim 13, wherein each of the first and sixth transistors is configured to be turned on in a mite operation and the third transistor is configured to be turned on in a read operation.

15. An apparatus comprising:
   a pair of differential data lines;
   a single-ended data line;
   a first transistor coupled between a first power line supplied with a first voltage and one of the pair of differential data lines and coupled to the other of the pair of differential data lines at a control node thereof; and
   a second transistor coupled between a second power line supplied with a second voltage different from the first voltage and the one of the pair of differential data lines and coupled to the single-ended data line at a control node thereof.
   a third transistor coupled between the other of the pair of differential data lines and the single-ended data line, the third transistor receiving a control signal at a control node thereof; and
   a fourth transistor coupled between the second power line and the single-ended data line and coupled to the one of the pair of differential data lines at a control node thereof.

16. The apparatus of claim 15, wherein the first transistor is different in conductivity type from each of the second, third and fourth transistors.

17. The apparatus of claim 15, further comprising a fifth transistor coupled between the first power line and the other of the pair of differential data lines and coupled to the one of the pair of differential data lines at a control node thereof.

18. The apparatus of claim 15, further comprising:
   a sense amplifier circuit configured to amplify a voltage of the pair of differential data lines;
   a driver circuit configured to drive the single-ended data line;
   a fifth transistor coupled between the second power line and the fourth transistor, the fifth transistor configured to be turned on when the sense amplifier circuit amplifies the voltage of the pair of differential data lines; and
   a sixth transistor coupled between the second power line and the second transistor, the sixth transistor configured to be turned on when the driver circuit drives the single-ended data line.

19. The apparatus of claim 15, further comprising a precharge circuit configured to precharge the pair of differential data lines to the first voltage.

20. The apparatus of claim 18, further comprising a seventh transistor coupled between the first power line and the other of the pair of differential data lines and coupled to the one of the pair of differential data lines at a control node thereof;
   wherein the first and seventh transistors are first conductivity type transistors and the second, third, fourth, fifth and sixth transistors are second conductivity type transistors.

* * * * *

UNITED STATES PATENT AND TRADEMARK OFFICE
CERTIFICATE OF CORRECTION

PATENT NO. : 9,824,725 B2  
APPLICATION NO. : 15/493816  
DATED : November 21, 2017  
INVENTOR(S) : Yoshinori Matsui Page 1 of 1

It is certified that error appears in the above-identified patent and that said Letters Patent is hereby corrected as shown below:

In the Claims

| | Reads | Should Read |
|---|---|---|
| Column 8, Line 51 | "The apparatus of claim 1.," | --The apparatus of claim 1,-- |
| Column 9, Line 13 | "configured to he turned on" | --configured to be turned on-- |
| Column 9, Line 34 | "turned on in a mite" | --turned on in a write-- |
| Column 10, Line 3 | "node thereof." | --node thereof;-- |

Signed and Sealed this  
Twenty-fifth Day of September, 2018

Andrei Iancu  
*Director of the United States Patent and Trademark Office*